United States Patent [19]

Oguchi et al.

[11] 4,352,053
[45] Sep. 28, 1982

[54] TEMPERATURE COMPENSATING VOLTAGE GENERATOR CIRCUIT

[75] Inventors: Takuro Oguchi, Kawasaki; Zenichi Ohsawa, Yokohama, both of Japan; Shinichi Murai, Santa Clara, Calif.

[73] Assignee: Fujitsu Limited, Kawasaki, Japan

[21] Appl. No.: 257,551

[22] Filed: Apr. 27, 1981

[30] Foreign Application Priority Data

| Apr. 28, 1980 | [JP] | Japan | 55-56546 |
| Apr. 28, 1980 | [JP] | Japan | 55-56547 |
| Apr. 28, 1980 | [JP] | Japan | 55-56548 |
| Apr. 28, 1980 | [JP] | Japan | 55-56549 |

[51] Int. Cl.³ ............................................. G05F 1/60
[52] U.S. Cl. .................................... 323/220; 323/229; 323/233; 323/907; 307/310; 330/256; 330/289; 330/143
[58] Field of Search ................ 307/310; 330/256, 266, 330/272, 289, 143; 331/176; 323/220, 229, 230, 231, 233, 907

[56] References Cited

U.S. PATENT DOCUMENTS

| 3,054,966 | 9/1962 | Etherington . | |
| 3,278,828 | 10/1966 | Klasens | 307/310 X |
| 3,294,974 | 12/1966 | Riebs | 307/310 X |
| 3,373,379 | 3/1968 | Black . | |
| 3,449,599 | 6/1969 | Henry . | |
| 3,454,903 | 7/1969 | Page . | |
| 3,484,867 | 12/1969 | Babcock | 330/266 |
| 3,508,168 | 4/1970 | Chan . | |
| 3,638,049 | 1/1972 | Wouterus Bom | 307/310 |
| 4,099,415 | 7/1978 | Hartzell, Jr. . | |
| 4,243,948 | 1/1981 | Schade, Jr. | 323/316 X |

FOREIGN PATENT DOCUMENTS

1949738 4/1971 Fed. Rep. of Germany .

OTHER PUBLICATIONS

IBM Technical Disclosure Bulletin, "Temperature Compensated Current Source," E. P. Bakke & C. C. Hanson, vol. 8, No. 9, Feb. 1966.

*Primary Examiner*—William M. Shoop
*Attorney, Agent, or Firm*—Staas & Halsey

[57] ABSTRACT

A temperature compensating voltage generator circuit for compensating temperature characteristics of an electric circuit whose electrical characteristic varies in accordance with the change of the ambient temperature and whose electrical characteristic can be changed or controlled by a control voltage. The temperature compensating voltage generator circuit comprising a plurality of temperature sensitive resistor circuits, a plurality of diode circuits and one or more resistor circuits. A temperature compensating voltage from the temperature compensating voltage generator circuit being independently adjustable at each predetermined temperature.

25 Claims, 26 Drawing Figures

TEMPERATURE COMPENSATING VOLTAGE GENERATOR CIRCUIT

BACKGROUND OF THE INVENTION (1) Field of the Invention

The present invention relates to a temperature compensating voltage generator circuit, and more particularly to a temperature compensating voltage generator circuit used for temperature compensation of electric circuits whose electric characteristics can be controlled by a control voltage.

(2) Description of the Prior Art

In general, an electric characteristic of an electric circuit such as a gain or an oscillation frequency of an amplifier or an oscillator changes due to the change of the temperature of the surroundings and, therefore, such an electric circuit comprises a means for temperature compensation. For example, as illustrated in FIG. 1, a control voltage such as a DC bias potential of an electric circuit CKT, such as an amplifier which is operated by an operating voltage $V_{CC}$, is produced by a control voltage generator circuit, i.e., temperature compensating voltage generator circuit consisting of resistors R1 and R2 and a negative coefficient temperature sensitive resistor S, and, the control voltage is changed in accordance with the change of the ambient temperature, so that the electric characteristic such as the gain of the electric circuit CKT is maintained in a constant condition.

Since the theoretical estimation of the temperature characteristics of the electric circuit CKT is generally difficult, the temperature characteristics are practically measured by using the practical circuit device and the resistors R1 and R2 and the negative temperature coefficient temperature sensitive resistor S are selected. However, in many cases the temperature characteristics of the electrical circuit CKT do not show simple or linear curves, so that conventional means cannot effect substantially complete temperature compensation and it takes a long time to determine the characteristic of the temperature compensating voltage generator circuit. When the characteristics of the electrical circuit CKT have changed due to the variation over a period of time, it is necessary to stop the operation of the electric circuit CKT in order to readjust the characteristics of the temperature compensating voltage generator circuit.

When it is necessary to effect complete temperature compensation, the characteristic of the electric circuit is practically measured at various temperatures and the control voltages, i.e., the temperature compensating voltages at the measured temperatures are determined so that the characteristic of the electric circuit is equalized. However, in the conventional temperature compensating voltage generator, it is impossible to adjust the value of the control voltage independently at various temperatures, so that the adjustment of the compensating voltage of the temperature compensating voltage generator circuit is very difficult. For example, when the compensating voltage is adjusted at another temperature after an adjustment of the compensating voltage at a base temperature, for example a normal temperature, the compensating voltage at the base temperature which is previously adjusted, changes.

Moreover, in the above-mentioned conventional circuit, when the temperature characteristic of the control voltage for effecting temperature compensation cannot be approximated by a first order curve, it is very difficult to effect temperature compensation.

SUMMARY OF THE INVENTION

It is an object of the present invention to provide a temperature compensating voltage generator circuit in which the compensating voltage such as a DC bias voltage can be adjusted independently at each temperature in order to obtain a required characteristic of the compensating voltage, so that it is possible to adjust the temperature characteristic of an electric circuit easily and almost completely.

It is another object of the present invention to provide a temperature compensating voltage generator circuit in which the change of the temperature characteristics of an electric circuit can be readjusted without stopping the operation of the electric circuit.

According to the present invention, there is provided a temperature compensating voltage generator circuit for compensating temperature characteristics of an electric circuit whose electrical characteristic can be controlled by a control voltage, which includes: a plurality of temperature sensitive circuits each of which includes a parallel connection of a diode circuit and a temperature sensitive resistor circuit, the temperature sensitive circuits being connected series. The circuit also includes one or more resistor circuits which are connected in series with the plurality of temperature sensitive circuits, the series connection of the temperature sensitive circuits and the resistor circuits comprising a voltage divider circuit, the divided output voltage from the voltage divider circuit being used as a temperature compensating voltage for the electric circuit.

According to the present invention, there is also provided a temperature compensating voltage generator circuit for compensating temperature characteristics of an electric circuit whose electrical characteristic can be controlled by a control voltage, which includes: a plurality of voltage dividers each of which includes a resistor circuit and a temperature sensitive circuit; and a plurality of differential amplifiers each of which receives an output voltage from one of the voltage dividers. The circuit also includes a plurality of level adjusting circuits for adjusting levels of output voltages from the differential amplifiers and a combining circuit which combines output voltages from the level adjusting circuits in order to generate a temperature compensating voltage.

According to the present invention, there is also provided a temperature compensating voltage generator circuit for compensating temperature characteristics of an electric circuit whose electrical characteristic can be controlled by a control voltage, which includes: a plurality of voltage divider circuits which include adjustable resistors and whose output voltages are adjustable by the adjustable resistors. The circuit also includes a plurality of temperature sensitive resistor circuits and an operational amplifier whose first input terminal receives the output voltages from the voltage divider circuits through the temperature sensitive resistor circuits and which outputs a temperature compensating voltage.

DESCRIPTION OF THE PREFERRED EMBODIMENTS

With reference to the attached drawings, the present invention will now be explained.

Figure 2:
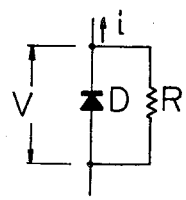
FIG. 2 is a circuit diagram illustrating the principle of the present invention.

FIG. 2 is a circuit diagram which illustrates the principle of the present invention. In FIG. 2, a diode D and a resistor R are connected parallel with each other and a current i flows through this parallel circuit. When the voltage drop V of the parallel circuit is lower than the forward biased voltage $V_D$ of the diode D, the diode D is in a cut off condition so that the voltage drop V is equal to i·R and the voltage drop V can be changed by changing the resistance of the resistor R. When the voltage drop V reaches the forward biased voltage $V_D$, for example about 0.7 V in the case of a silicon diode, the diode D turns on and a part of the current i flows through the diode D. In this condition, the voltage drop does not change and is equal to the forward biased voltage $V_D$ even if the value of the resistance of the resistor R is changed.

Figure 3:
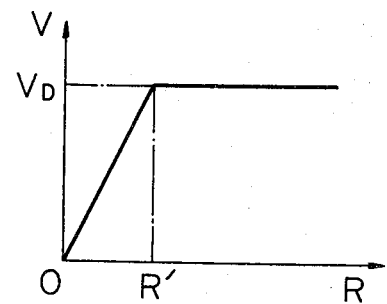
FIG. 3 is a graph illustrating an electrical characteristic of the circuit of FIG. 2.

FIG. 3 illustrates a relation between the voltage drop V of the aforementioned parallel circuit and the resistance of the resistor R. As apparent from FIG. 3, the voltage drop V is equal to the forward biased voltage $V_D$ when the resistance of the resistor R is equal to or larger than R'. Where R' is equal to $V_D/i$. Assume that the forward biased voltage $V_D$ is equal to 0.7 V and the current i is equal to 2 mA. In this condition, when the resistance of the resistor R is equal to or larger than 350 ohms. The voltage drop V is equal to 0.7 V, and, when the resistance of the resistor R is lower than 350 ohms, the voltage drop V is equal to the product of the resistance value of the resistor R and the current value i.

In the present invention, the resistor R is substituted for by a negative or positive temperature coefficient temperature sensitive resistor. Therefore, in a range of the ambient temperature in which the resistance of the temperature sensitive resistor is lower than R' of FIG. 3, the voltage drop V changes in accordance with the change of the ambient temperature. In a range of the ambient temperature in which the resistance of the temperature sensitive resistor is higher than or equal to R', the voltage drop V is approximately equal to the forward biased voltage $V_D$ and does not change even when the ambient temperature has changed.

Figure 4:
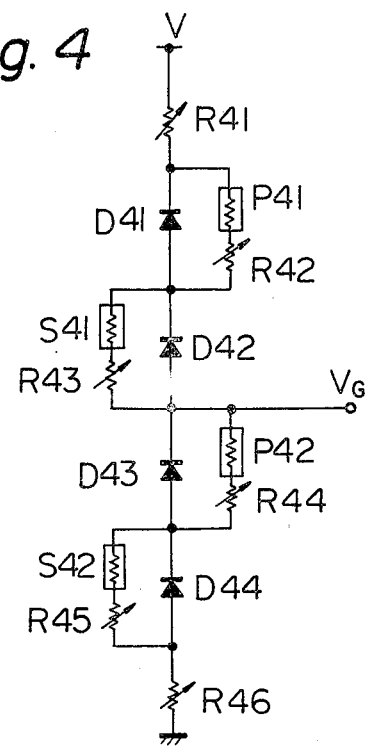
FIG. 4 is a circuit diagram illustrating a temperature compensating voltage generator circuit as an embodiment of the present invention.

FIG. 4 is a circuit diagram illustrating a temperature compensating voltage generator circuit as an embodiment of the present invention. The circuit of FIG. 4 comprises adjustable resistors R41 through R46, positive temperature coefficient temperature sensitive resistors (hereinafter referred to as PTC resistors) P41 and P42, negative temperature coefficient temperature sensitive resistors (hereinafter referred to as NTC resistors) S41 and S42 and diodes D41 through D44. In FIG. 4, V designates the potential of a voltage source and $V_G$ designates the potential of the control voltage, i.e., the temperature compensating voltage. The diode D41, the PTC resistor P41 and the resistor R42 comprise a first temperature sensitive circuit; the diode D42; the NTC resistor S41 and the resistor R43 comprise a second temperature sensitive circuit, the diode D43, the PTC resistor P42 and the resistor R44 comprise a third temperature sensitive circuit, and the diode D44, the NTC resistor S42 and the resistor R45 comprise a fourth temperature sensitive circuit. Assume that each of the PTC resistors P41 and P42 and the NTC resistors S41 and S42 of the first through the fourth temperature circuits has a larger resistance than R' of FIG. 3 at the base temperature, for example the normal temperature. In this condition, the diodes D41 through D44 are all in a turned on condition regardless of the resistance value of the resistors R42 through R45 and the control voltage $V_G$ can be adjusted by changing the resistance of the resistors R41 and R46. The control voltage $V_G$ is as follows.

$$V_G = \left(\frac{V - 4V_D}{R41 + R46}\right) R46 + 2V_D \quad (1)$$

When the ambient temperature is lower than the base temperature, the resistances of the PTC resistors P41 and P42 decrease and the resistances of the NTC resistors S41 and S42 increase. Therefore, at such a lower temperature, if the resistance of the resistor R42 is adjusted so as to turn off the diode D41, a current from the voltage source flows through the PTC resistor P41 and the resistor R42. Therefore, the potential drop of the first temperature sensitive circuit becomes smaller than the forward biased voltage $V_D$ of the diode D41 and determined by the total resistance of the series connection of the PTC resistor P41 and the resistor R42. In this condition, the control voltage $V_G$ becomes higher than that of the base temperature.

At such a lower temperature, if the resistance of the resistor R44 of the third temperature sensitive circuit is adjusted so as to turn off the diode D43, the control voltage $V_G$ becomes lower than that of the base temperature. It should be noted that, at such a lower temperature, the resistances of the NTC resistors S41 and S42 become larger and thus the voltage drop of each of the second and fourth temperature sensitive circuits is equal to the forward biased voltage $V_D$.

When the ambient temperature is higher than the base temperature, the control voltage $V_G$ can be higher or lower than that of the base temperature by adjusting the resistance of the resistor R43 or R45 of the second or fourth temperature sensitive circuit so as to turn off one of the diodes D42 and D44. The resistance-temperature characteristics of the PTC resistors P41 and P42 or of the NTC resistors S41 and S42 can be equal to each other or can be different from each other. If the PTC resistors P41 and P42 and/or the NTC resistors S41 and S42 having the different resistance-temperature characteristics are used, it is also possible to generate the control voltage $V_G$ determined by the difference of the resistance-temperature characteristics in the condition that the diodes D41 and D43 and/or the diodes D42 and D44 are both turned on at the same temperature.

Figure 5:
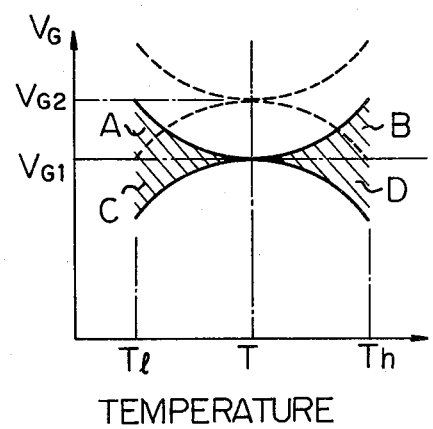
FIG. 5 is a graph illustrating a characteristic of the circuit of FIG. 4.

FIG. 5 illustrates an adjustable range of the control voltage $V_G$ of the circuit in FIG. 4. After the control voltage $V_G$ at the base temperature T is adjusted to be $V_{G1}$ by using the resistors R41 and R46, the level of the control voltage at a lower temperature T1 can be adjusted by the resistor R42 or R44 and the level of the control voltage at a higher temperature Th can be adjusted by the resistor R43 or R45 within the hatched region of FIG. 5. It should be noted that the level of the control voltage $V_{G1}$ at the base temperature T is not changed even when the levels of the control voltage at the lower temperature T1 and the higher temperature Th are changed. Therefore, it is possible to independently adjust the level of the control voltage at each adjusting temperature. The control voltage changes continuously according to the change of the ambient temperature within a range including the adjusting temperatures such as the high temperature Th and the lower temperature T1.

In the hatched adjustable range of FIG. 5, an area A is obtained by the resistance value of the resistor R42 and the resistor-temperature characteristic of the PTC resistor P41 of the first temperature sensitive circuit, and areas B, C and D are obtained by the second, third and fourth temperature sensitive circuits, respectively.

In FIG. 5, if the control voltage $V_G$ at the base temperature T is adjusted to $V_{G2}$, the adjustable range of the control voltage $V_G$ becomes an area shown by dotted lines of FIG. 5.

Figure 6:
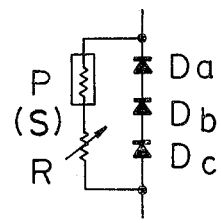
FIG. 6 is a circuit diagram illustrating a temperature sensitive circuit as another embodiment of the present invention.

In each of the first through the fourth temperature sensitive circuits mentioned above, each includes one diode which can be D41, D42, D43 or D44, the maximum adjustable range of the voltage drop is the forward biased voltage $V_D$ of each of the diodes D41 through D44. However, as illustrated in FIG. 6, the maximum adjustable range of each of the temperature sensitive circuits can be expanded by using a series connection of a plurality of diodes such as $D_a$, $D_b$ and $D_c$ which is connected parallel to a series connection of the resistor R and the PTC resistor P or the NTC resistor S. When the series connection of three diodes $D_a$, $D_b$ and $D_c$ each having the forward biased voltage $V_D$ of 0.7 V is used, the voltage drop of each temperature sensitive circuit can be changed in a range from 0 through 2.1 V. Practically speaking, the voltage drop of the temperature sensitive circuit of FIG. 6 does not become zero even if the resistance of the resistor R is adjusted to zero, since the resistance of the PTC resistor P or the NTC resistor S does not become zero.

Figure 7:
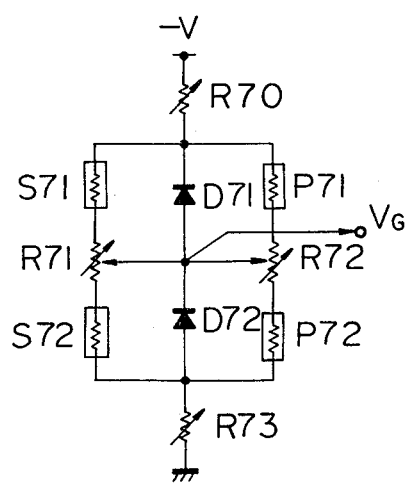
FIG. 7 is a circuit diagram illustrating a temperature compensating voltage generator circuit as still another embodiment of the present invention.

FIG. 7 illustrates another embodiment of the present invention. The temperature compensating voltage generator of FIG. 7 comprises adjustable resistors R70 through R73, diodes D71 and D72, PTC resistors P71 and P72 and NTC resistors S71 and S72. The control voltage $V_G$ at the base temperature is obtained by dividing a voltage $-V$ by the resistors R70 and R73. The resistance-temperature characteristics are selected so that the resistance of each of the PTC resistors P71 and P72 and the NTC resistors S71 and S72 is large and the diodes D71 and D72 are turned on. Therefore, at the base temperature, a current flows through the resistor R73, the diodes D72 and D71 and the resistor R70, and the control voltage $V_G$ does not change even if the resistances of the resistor R71 and R72 are changed.

The adjustment of the temperature characteristic of the circuit of FIG. 7 at a higher or lower temperature is effected by the resistors R71 and R72. For example, if the sliders of the resistors R71 and R72 are both moved in the direction of the NTC resistor S71 and the PTC resistor P71, the diode D72 is in a turned on condition both at the lower temperature and at the higher temperature and the diode D71 is in a turned off condition. Since at the lower temperature, the resistance of the PTC resistor P71 becomes low due to its resistor-temperature characteristic and at the higher temperature, the resistance of the NTC resistor S71 becomes low due to its resistor-temperature characteristic, the control voltage $V_G$ at both the higher (and lower temperature becomes higher) than that of the base temperature.

If the sliders of the resistors R71 and R72 are both moved in the direction of the NTC resistor S72 and the PTC resistor P72, the diode D72 is in a turned off condition both at the lower temperature and at the higher temperature. Therefore, the control voltage $V_G$ of both the higher and lower temperature becomes lower than that of the base temperature.

Figure 8:
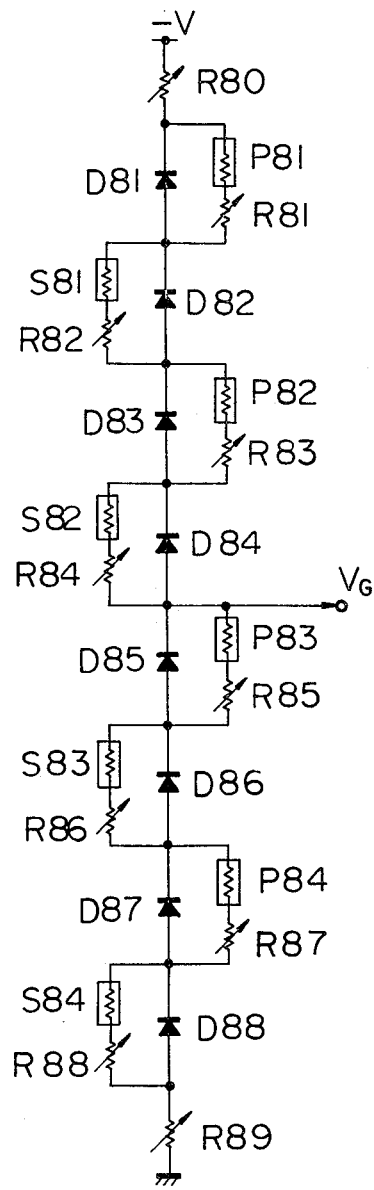
FIG. 8 is a circuit diagram illustrating a temperature compensating voltage generator circuit as still another embodiment of the present invention.

FIG. 8 illustrates a temperature compensating voltage generator circuit as still another embodiment of the present invention. In the above-mentioned embodiment shown in FIG. 7, the characteristic of the control voltage $V_G$ can be adjusted at three points, i.e., the base temperature, the lower temperature and the higher temperature, while in the embodiment of FIG. 8, the characteristic of the control voltage $V_G$ can be adusted at five points. The circuit of FIG. 8 comprises first through eighth temperature sensitive circuits which comprise diodes D81 through D88, resistors R81 through R88, and, PTC resistors P81 through P84 and NTC resistors S81 through S84. At the base temperature, the control voltage $V_G$ is adjusted by changing the resistances of resistors R80 and R89 which divide a power supply voltage $-V$. The PTC resistors P81 and P82 of the first and the third temperature sensitive circuits have different resistor-temperature characteristics and the NTC resistors S81 and S82 of the second and the fourth temperature sensitive circuits have different resistor-temperature characteristics. The PTC resistors P83 and P84 of the fifth and the seventh temperature sensitive circuits and the NTC resistors S83 and S84 of the sixth and the eighth temperature sensitive circuits have also different resistor-temperature characteristics. Therefore, the adjustable points of the temperature can be increased.

For example, the resistor-temperature characteristics of the NTC resistors and the PTC resistors of the first through the eighth temperature sensitive circuits are selected so as to turn on all the diodes D81 through D88 at the base temperature. The control voltage $V_G$ is adjusted to a value by setting the resistances of the resistors R80 and R89 at the base temperature. At a first low temperature which is lower than the base temperature, the resistances of the resistors R83 and R87 of the third and the seventh temperature sensitive circuits are adjusted. The PTC resistors P81 and P83 of the first and the fifth temperature sensitive circuits are selected so that the diodes D81 and D85 are not turned off at the first low temperature and the diodes D81 and D85 are turned off at a second low temperature which is lower than the first temperature if the resistances of the resistors R81 and R85 are decreased, for example, to zero. Therefore, at the second low temperature, the control voltage $V_G$ can be adjusted by the resistors R81 and R85 of the first and the fifth temperature sensitive circuits.

At a first high temperature which is higher than the base temperature, the control voltages $V_G$ can be adjusted by the resistors R84 and R88 of the fourth and the eighth temperature sensitive circuits and, at a second high temperature which is higher than the first high temperature, the control voltage $V_G$ can be adjusted by the resistors R82 and R86 of the second and the sixth temperature sensitive circuits. The NTC resistors S81 and S83 are selected so that the resistances thereof are large so as to keep the diodes D82 and D86 in a turned on condition at the first high temperature and the resistances thereof become small so as to keep the diodes D82 and D86 in a turned off condition at the second high temperature.

Therefore, in the circuit of FIG. 8, it is possible to set the control voltages at every temperature independently by adjusting the resistors of the respective temperature sensitive circuits after the adjustment of the control voltage at the base temperature.

In the above-mentioned embodiments, it is possible to replace the diodes of the temperature sensitive circuits by zener diodes. It is also possible to connect a direct current amplifier to the output terminal of the temperature compensating voltage generator circuit in order to enlarge the variable range of the output control voltage $V_G$. It is further possible to construct all temperature sensitive circuits by using only the PTC resistors or only the NTC resistors as the temperature sensitive resistors, if the temperature characteristic of the electric circuit is limited.

Figure 9:
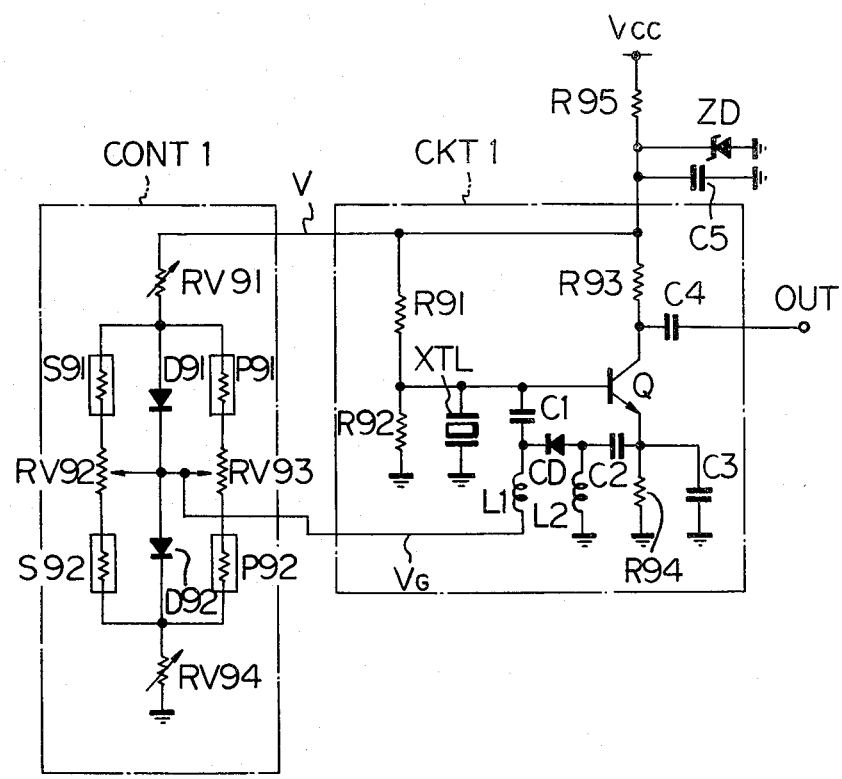
FIG. 9 is a circuit diagram illustrating a quartz oscillator circuit having a temperature compensating voltage generator according to the present invention.

FIG. 9 illustrates an oscillator circuit whose frequency-temperature characteristic is compensated by using the aforementioned temperature compensating voltage generator circuit of FIG. 7. The oscillator circuit of FIG. 9 comprises a control voltage generator CONT 1, an oscillator portion CKT1 and a decoupling circuit consisting of a zener diode ZD, a capacitor C5 and a resistor R95. The oscillator portion CKT1 comprises a quartz oscillator element XTL, a transistor Q, a variable capacitance diode CD, inductors $L_1$ and $L_2$, capacitors C1 through C4 and resistors R91 through R94. The control voltage generator CONT1 has the same circuit structure as the circuit of FIG. 7 and comprises variable or adjustable resistors RV91 through RV94, diodes D91 and D92, NTC resistors S91 and S92 and PTC resistors P91 and P92.

In the oscillator portion CKT1, the oscillation frequency can be changed by the potential applied to the variable capacitor diode CD, and the potential is supplied from the control voltage generator CONT 1.

In the circuit of FIG. 9, the resistance-temperature characteristics of the NTC resistors S91 and S92 and the PTC resistors P91 and P92 are selected so that the resistance of each of these NTC resistors and the PTC resistors is large and thus a current flows through the diodes D91 and D92 and the resistors RV91 and RV94 at the base temperature for example the normal temperature of 25° C. Assume that the forward biased voltage of the diodes D91 and D92 is $V_D$ and the potential of the power supply voltage applied to the control voltage generator CONT 1 is V. In this condition, the control voltage $V_G$ is as follows.

$$V_G = \left( \frac{V - 2V_D}{RV91 + RV94} \right) RV94 + V_D \qquad (2)$$

Therefore, at the base temperature, the control voltage $V_G$ can be adjusted by adjusting the variable resistors RV91 and/or RV94 so that the output signal having a desired frequency is obtained from an output terminal OUT.

If the oscillator portion CKT 1 has a frequency-temperature characteristic such that the oscillation frequency at a high temperature which is, for example, 20° C. higher than the base temperature becomes lower than that of the base temperature and the oscillation frequency at a low temperature which is, for example, 20° C. lower than the base temperature also becomes lower than that of the base temperature, it is necessary to raise the oscillation frequencies at the high and the low temperature. For this purpose, the sliders of the adjustable resistors RV92 and RV93 are both adjusted to positions which are nearer to the NTC resistor S91 and the PTC resistor P91 respectively. Therefore, at the high temperature, the resistance of the NTC resistor S91 becomes low and the diode D91 is turned off, so that the control voltage $V_G$ becomes large in accordance with the decrease of the resistance of the NTC resistor S91. The temperature characteristic of the control voltage can be adjusted by the adjustable resistor RV92.

At the low temperature, the resistance of the PTC resistor P91 becomes low and the diode D91 is turned off, so that the control voltage $V_G$ becomes high in accordance with the decrease of the resistance of the PTC resistor P91. The amount of the change of the control voltage in accordance with the change of the temperature can be adjusted by the adjustable resistor RV93.

Contrary to the above-mentioned case, if it is necessary to lower the control voltage both at the high and the low temperature, the sliders of the adjustable resistors RV92 and RV93 are moved to positions which are nearer to the NTC resistor S92 and the PTC resistor P92 respectively.

Therefore, in the above-mentioned circuit of FIG. 9, the control voltages at the high and the low temperature can be independently adjusted by the adjustable resistors RV92 and RV93 after the adjustment of the control voltage at the base temperature, and thus the adjustment of the control voltage $V_G$ can be easily adjusted and the frequency-temperature characteristic of the oscillator circuit can be completely compensated.

Practical experiments show that the stability of the oscillation frequency was improved from $\pm 10 \times 10^{-6}$ to $\pm 2 \times 10^6$ at the temperature range of 0 through 50° C. In this case, the adjustment of the control voltage $V_G$ was first effected at the base temperature of 25° C. and then at the high temperature of 50° C. and the low temperature of 0° C.

Figure 10:
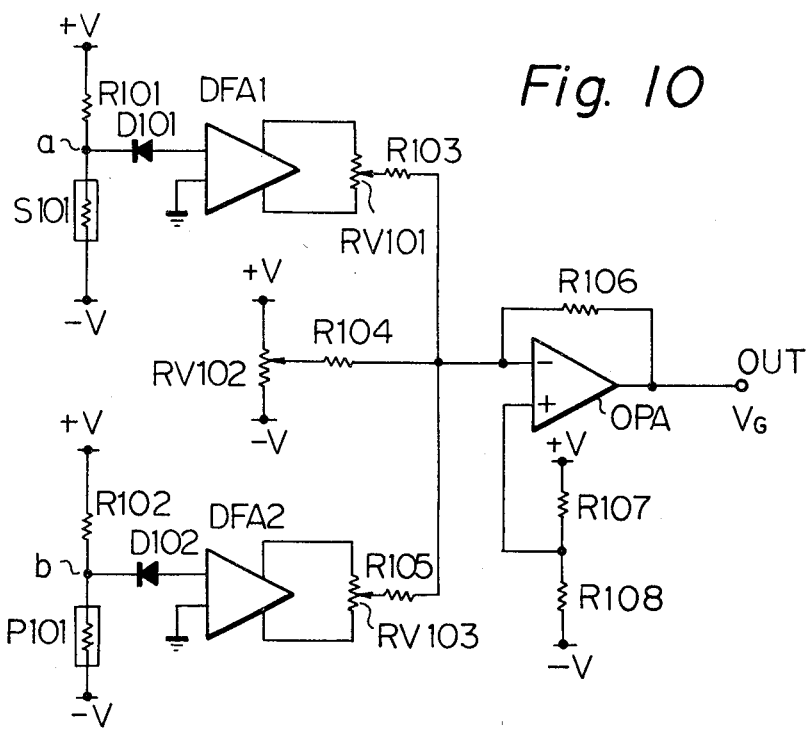
FIG. 10 is a circuit diagram illustrating a temperature compensating voltage generator circuit as still another embodiment of the present invention.

FIG. 10 is a circuit diagram illustrating another embodiment of the present invention. The temperature compensating voltage generator circuit of FIG. 10 comprises resistors R101 through R108, negative coefficient temperature sensitive resistor, i.e., a NTC resistor S101, a positive coefficient temperature sensitive resistor, i.e., a PTC resistor P101, diodes D101 and D102, differential amplifiers DFA1 and DFA2, adjustable resistors RV101 through RV103 and an operational amplifier OPA. OUT designates an output terminal of the control voltage and +V and −V designate power supply voltages. To a non-inverted input terminal of the operational amplifier OPA, a constant voltage from the voltage divider circuit comprising the resistors R107 and R108 is applied and to an inverted input terminal of the operational amplifier OPA, voltages adjusted by the adjustable resistors RV101 through RV103 are applied through the resistors R103 through R105 respectively, so that and addition circuit is constructed. Output voltages from a voltage divider circuit comprising of the resistor R101 and the NTC resistor S101 and from another voltage divider circuit comprising of the resistor R102 and the PTC resistor P101 are respectively applied to the input terminals of the differential amplifier DFA1 and DFA2 through the diodes D101 and D102, and the output voltages from the differential amplifiers DFA1 and DFA2 are applied to the adjustable resistors RV101 and RV103 respectively.

Assume that, at the base temperature for example the normal temperature, the resistances of the NTC resistor S101 and the resistor R101 are equal to each other and the resistances of the PTC resistor P101 and the resistor R102 are equal to each other. In this condition, the potentials of a point a and a point b in FIG. 10 are both equal to zero and the diodes D101 and D102 are both in a cut off condition so that the output potentials of the differential amplifiers DFA1 and DFA2 are both equal to zero. As a result, the control voltage $V_G$ from the output terminal OUT of the operational amplifier OPA is proportional to the output voltage from the adjustable resistor RV102. Therefore, at the base temperature, the control voltage $V_G$ can be adjusted by the adjustable resistor RV102.

At a high temperature which is higher than the base temperature, the resistance of the NTC resistor S101 becomes smaller and the potential of the point a of FIG. 10 becomes negative, so that the diode D101 is turned on and the differential amplifier DFA1 outputs a potential voltage corresponding to the potential of the point a. The output potential of the differential amplifier DFA1 is divided by the adjustable resistor RV101 and supplied to the inverted input terminal of the operational amplifier OPA through the resistor R103 to which the potential adjusted by the adjustable resistor RV102 is supplied through the resistor R104. Therefore, at a high temperature, the control voltage $V_G$ can be adjusted by the adjustable resistor RV101. It should be noted that, at a high temperature, the resistance of the PTC resistor P101 becomes larger and the potential of the point b of FIG. 10 becomes positive, so that the diode D102 is turned off and the output potential of the differential amplifier DFA2 is maintained at zero.

Figure 1:
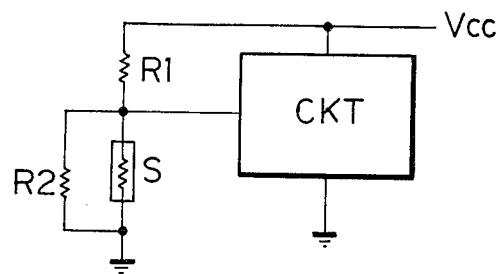
FIG. 1 is a block circuit diagram illustrating an electric circuit comprising a conventional temperature compensating circuit.

At a low temperature which is lower than the base temperature, the resistance of the NTC resistor S101 becomes larger and the potential of the point a of FIG. 1 becomes positive so that the diode D101 is turned off and the output potential of the differential amplifier DFA1 becomes zero. The resistance of the PTC resistor P101 becomes smaller and the potential of the point b of FIG. 10 becomes negative so that the diode D102 is turned on and the differential amplifier DFA2 outputs a potential voltage corresponding to the potential of the point b of FIG. 10. The output potential from the differential amplifier DFA2 is divided by the adjustable resistor RV103 and added to the potential adjusted by the adjustable resistor RV102. Therefore, at a low temperature, the control voltage $V_G$ can be adjusted by the adjustable resistor RV103.

Figure 11:
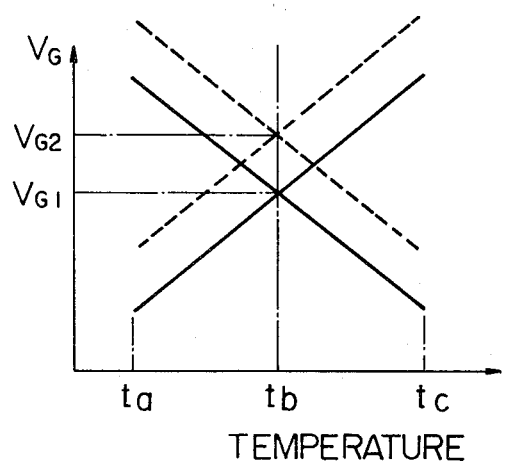
FIG. 11 is a graph illustrating an adjustable range of the temperature compensating voltage of the circuit of FIG. 10.

FIG. 11 illustrates adjustable ranges of the control voltage generated by the circuit of FIG. 10. In FIG. 11, if the control voltage is adjusted to $V_{G1}$ at the base temperature $t_b$, the adjustable range of the control voltage $V_G$ in a temperature range including the low temperature $t_a$ and the high temperature $t_c$ becomes an area between the solid lines of FIG. 11. If the control voltage $V_G$ at the base temperature $t_b$ is adjusted to $V_{G2}$, the adjustable range of the control voltage $V_G$ in the same temperature range becomes the area between the dotted lines of FIG. 11. It shold be noted that at every adjusting point such as $t_a$, $t_b$ and $t_c$, the control voltage $V_G$ can be adjusted independently.

Figure 12:
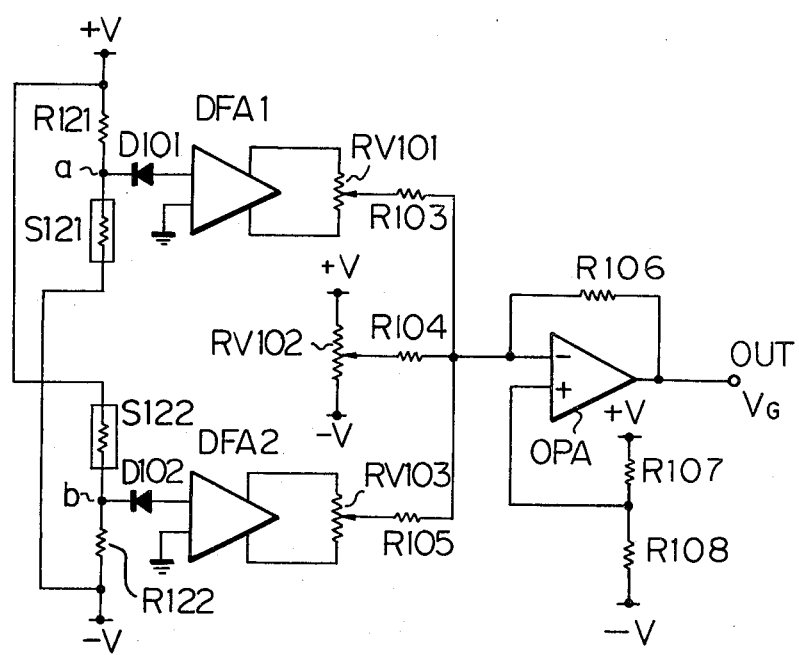
FIG. 12 is a circuit diagram illustrating a temperature compensating voltage generator circuit as still another embodiment of the present invention.

FIG. 12 is a circuit diagram illustrating a temperature compensating voltage generator as another embodiment of the present invention. The circuit of FIG. 12 corresponds to a circuit in which the PTC resistor P101 and the resistor R102 of FIG. 10 are respectively replaced by a resistor R122 and a NTC resistor S122. It is also possible to use the NTC resistors S121 and S122 having the same resistor-temperature characteristic with each other. In this embodiment, the potentials of the point a and the point b varies in accordance with the change of the ambient temperature. Therefore, after the adjustment of the control voltage by the adjustable resistor RV102 at the base temperature, the control voltages at a high temperature and at a low temperature can be independently adjusted by the adjustable resistors RV101 and RV103 respectively.

In the circuit of FIG. 12, it is also possible to use PTC resistors instead of the NTC resistors S121 and S122. In such a case, the control voltage at the high temperature can be adjusted by the adjustable resistor RV103 and the control voltage at the low temperature can be adjusted by the adjustable resistor RV101, independently. It is also possible to replace the adjustable resistor RV102 used for the adjustment of the control voltages at the base temperature by a voltage divider circuit having a fixed division ratio and to connect a voltage divider circuit comprising an adjustable resistor to the non-inverted input terminal of the operational amplifier OPA, so that the control voltage at the base temperature can be adjusted by the adjustable resistor. It is also possible to invert the polarity of connection of the diodes D101 and D102. In such a case the adjustable resistors corresponding to the high temperature and the low temperature are replaced by each other. It is also possible to omit the diodes D101 and D102 in case the resistance-temperature characteristics of the temperature sensitive resistors used in the control voltage generator circuit are different from each other.

Figure 13:
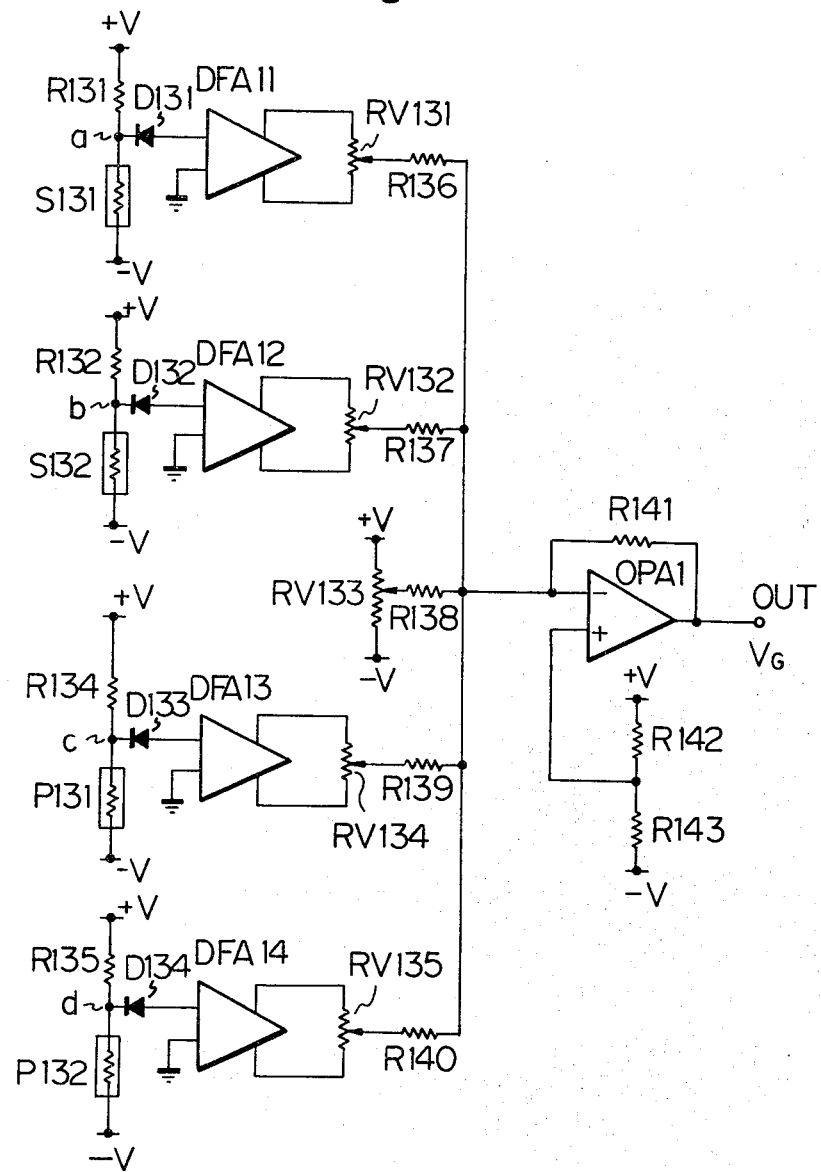
FIG. 13 is a circuit diagram illustrating a temperature compensating voltage generator circuit as still another embodiment of the present invention.

FIG. 13 is a circuit diagram illustrating a temperature compensating voltage generator circuit as still another embodiment of the present invention. In this embodiment, the adjustment of the characteristic of the control voltage can be effected at five points, i.e., the base temperature a first and a second low temperature and a first and a second high temperature. The circuit of FIG. 13 comprises NTC resistors S131 and S132, PTC resistors P131 and P132, resistors R131 through R143, diodes D131 through D134 differential amplifier DFA11 through DFA14, adjustable or variable resistors RV131 through RV135 and an operational amplifier OPA1. OUT designates an output terminal of the control voltage and +V and −V designate power supply voltages. The resistance-temperature characteristics of the NTC resistors S131 and S132 are different from each other, or, if the resistance-temperature characteristics are the same, the resistance of the resistors R131 and R132 which are respectively connected to the NTC resistors S131 and S132 are different from each other. With regard to the PTC resistors P131 and P132, the resistance-temperature characteristics are different from each other, or, the resistance of the resistors R134 or R135 which are respectively connected to the PTC resistors P131 and P132 are different from each other. Therefore, the potentials of points a through d of FIG. 13 are different for every degree of the adjustable temperature. For example, these NTC resistors and PTC resistors are selected so that the differential output potentials $V_a$ through $V_d$ from the differential amplifiers DFA11 through DFA14 become as illustrated in FIG. 14.

Figure 14:
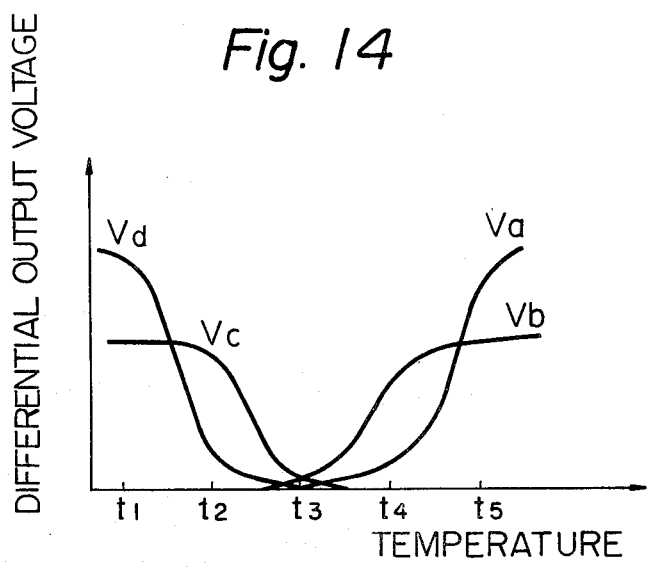
FIG. 14 is a graph illustrating the characteristics of the temperature sensitive circuits included in the circuit of FIG. 13.

At the base temperature, for example, $t_3$ of FIG. 14, the control voltage can be adjusted by the adjustable resistor RV133. At the first high temperature $t_4$ which is higher than the base temperature $t_3$ and at the second high temperature $t_5$ to which is higher than the first high temperature $t_4$, the control voltages can be adjusted by the adjustable resistors RV132 and RV131 respectively. At the first low temperature $t_2$ which is lower than the base temperature and at the second low temperature $t_1$ which is lower than the first low temperature $t_2$, the control voltage can be adjusted by the adjustable resistors RV134 and RV135, respectively.

Figure 15:
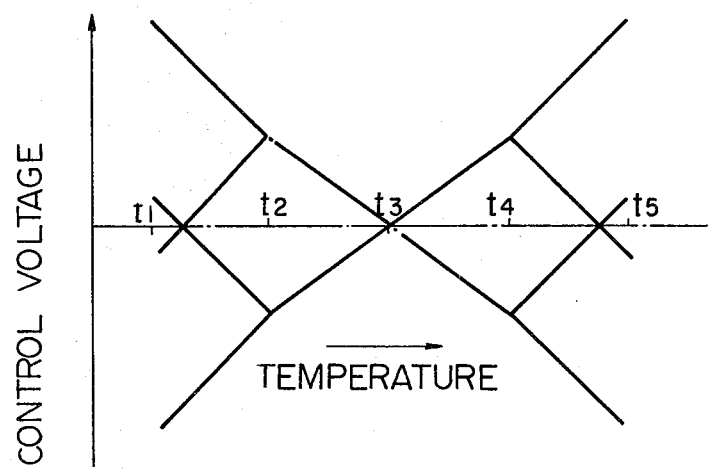
FIG. 15 is a graph illustrating the temperature characteristic of the temperature compensating voltage of the circuit of FIG. 13.

FIG. 15 illustrates an adjustable range of the control voltage. In the circuit of FIG. 13, since a negative or positive voltage at each temperature $t_1$, $t_2$, $t_4$ and $t_5$ is added to the control voltages at the base temperature $t_3$, it is also possible, for example, to adjust the temperature characteristic of the control voltage so that the control voltage at the first high temperature $t_4$ is higher than that at the base temperature $t_3$ and the control voltage at the second high temperature $t_5$ is lower than that at the base temperature.

Figure 16:
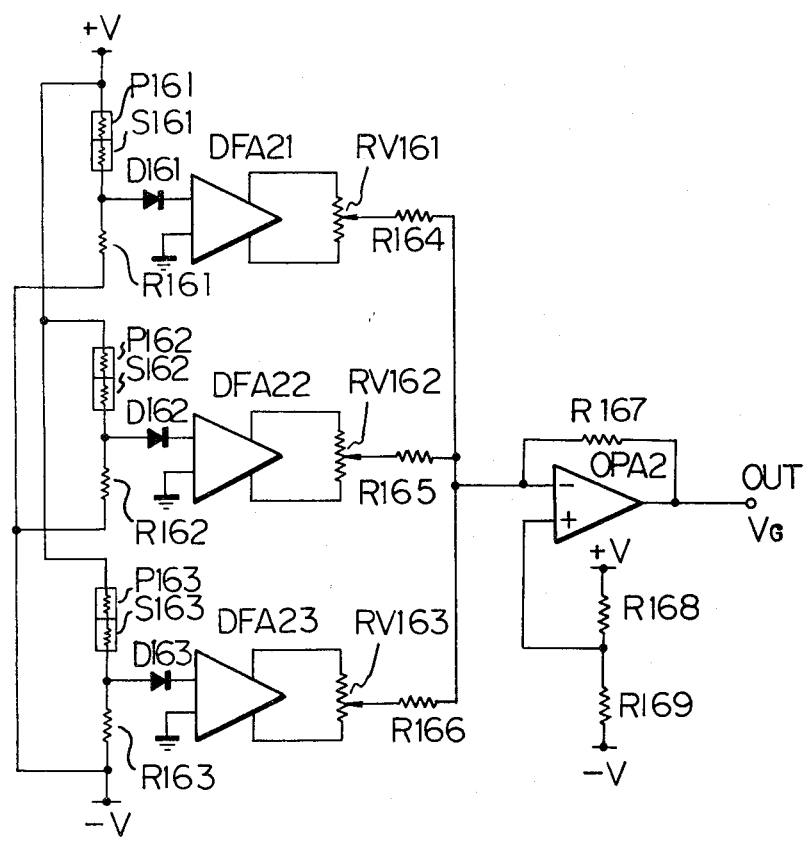
FIG. 16 is a circuit diagram illustrating a temperature compensating voltage generator circuit as still another embodiment of the present invention.

FIG. 16 is a circuit diagram illustrating a temperature compensating voltage generator circuit as still another embodiment of the present invention. The circuit of FIG. 16 comprises temperature sensitive circuits each comprising a series connection of a PTC resistor P161, P162, or P163 and a NTC resistor S161, S162 or S163. The circuit of FIG. 16 also comprises diodes D161 through D163, differential amplifiers DFA21 through DFA23, resistors R161 through R169, adjustable resistors RV161 through RV163 and an operational amplifier OPA2. OUT designates an output terminal of the control voltage and +V and −V designate power supply voltages. The resistance-temperature characteristic of each series connection in each of the temperature sensitive circuits have, as illustrated by A, B or C in FIG. 17, a valley point at which the total resistance of the series connection becomes minimum and the valley points in each temperature sensitive circuit differ from each other. The input voltages of the differential amplifiers DFA21 through DFA23 have temperature characteristics as illustrated by A', B' and C' of FIG. 18. Therefore, at the temperatures $t_1$, $t_2$ and $t_3$, the output potentials from the differential amplifiers DFA21, DFA22 and DFA23 respectively become maximum, and the characteristic of the control voltage can be adjusted independently by the adjustable resistors RV161, RV162 and RV163 at the temperatures $t_1$, $t_2$ and $t_3$ respectively.

Figure 19:
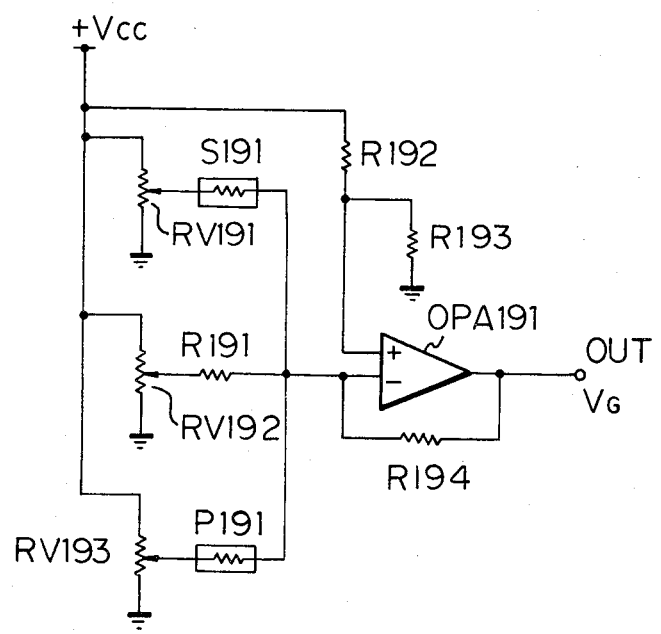
FIG. 19 is a circuit diagram illustrating a temperature compensating voltage generator circuit as still another embodiment of the present invention.

FIG. 19 is a circuit diagram illustrating a temperature compensating voltage generator circuit as still another embodiment of the present invention. The circuit of FIG. 19 comprises adjustable or variable resistors RV191 through RV193 comprising voltage dividers whose voltage division ratios are adjustable, a NTC resistor S191, a PTC resistor P191, resistors R191 through R194 and an operational amplifier OPA191. In FIG. 19, OUT designates an output terminal of the control voltage and $+V_{CC}$ designates a power supply voltage. In the circuit of FIG. 19, a constant voltage from a voltage divider circuit which comprising of the resistors R192 and R193 and which divides the power supply voltage $+V_{CC}$ is applied to the non-inverted input terminal of the operational amplifier OPA191. The inverted input terminal of the operational amplifier OPA191 receives the voltages adjusted by the adjustable resistors RV191, RV192 and RV193 through the NTC resistor S191, the resistor R191 and the PTC resistor p191 respectively, that is, the adjusted voltages are added by the adder circuit which comprises the NTC resistor S191, the resistor R191, the PTC resistor p191, the feedback resistor R194 and the operational amplifier OPA191 and which adds the adjusted voltages under the gains corresponding to the ratio of the resistance of the NTC resistor S191, the resistor R191 and the PTC resistor P191 to the feedback resistor R194.

At the base temperature, the resistance of the NTC resistor S191 and the PTC resistor P191 is larger than that of the resistor R191, and thus the gain of the voltage adjusted by the adjustable resistor RV192 is larger than that of each of the voltages from the adjustable resistors RV191 and RV193. Therefore, at the base temperature, the control voltage $V_G$ can be adjusted by the adjustable resistor RV192.

At a low temperature which is lower than the base temperature, the resistance of the PTC resistor p191 becomes smaller so that the gain of the voltage adjusted by the adjustable resistor RV193 becomes large and, therefore, the control voltage $V_G$ at the low temperature can be adjusted by the adjustable resistor R193.

At a high temperature which is higher than the base temperature, the resistance of the NTC resistor S191 becomes smaller so that the gain of the voltage adjusted by the adjustable resistor RV191 becomes large and, therefore, the control voltage $V_G$ at the high temperature can be adjusted by the adjustable resistor R191.

The adjustable range of the control voltage $V_G$ of the circuit of FIG. 19 is the same as the adjustable range illustrated in FIG. 11. As apparent from FIG. 11, if the control voltage is adjusted to $V_{G1}$ at the base temperature $t_b$, the adjustable range of the control voltage $V_G$ in the temperature range including the low temperature $t_a$ and the high temperature $t_c$ becomes the range illustrated by solid lines of FIG. 11. If the control voltage is adjusted to $V_{G2}$ at the base temperature $t_b$, the adjustable range becomes the range illustrated by the dotted lines.

Figure 20:
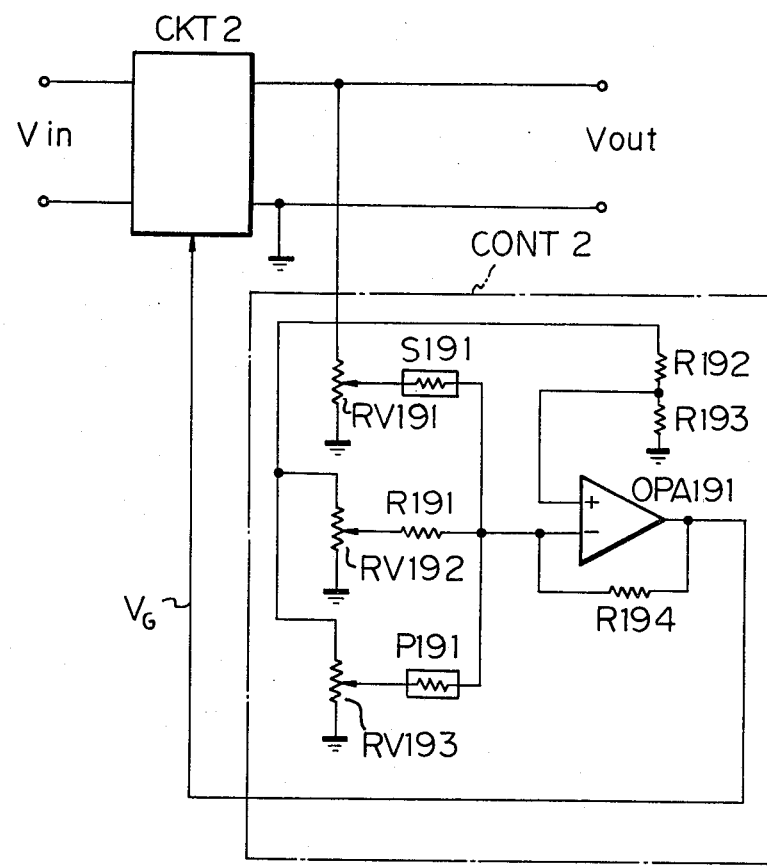
FIG. 20 is a circuit diagram illustrating a voltage regulator circuit having a temperature compensating voltage generator circuit according to the present invention.

FIG. 20 illustrates a voltage regulator system comprising the control voltage generator circuit of FIG. 19. In FIG. 20, a voltage regulator circuit CKT2 receives an input voltage $V_{in}$ and outputs a stabilized output voltage $V_{out}$. The regulating characteristic of the voltage regulator circuit CKT2 varies in accordance with the change of the ambient temperature and thus the potential of the output voltage $V_{out}$ changes according to the variation of the ambient temperature. In order to generate the output voltage $V_{out}$ having a constant potential, the control voltage, i.e., temperature compensating voltage $V_G$ is applied from the control voltage generator circuit CONT2 to the voltage regulator circuit CKT2. The control voltage $V_G$ is, for example, added to the error voltage of the voltage regulator circuit CKT2 detected from the output voltage $V_{out}$ and a reference voltage not shown in the drawing.

Figure 21:
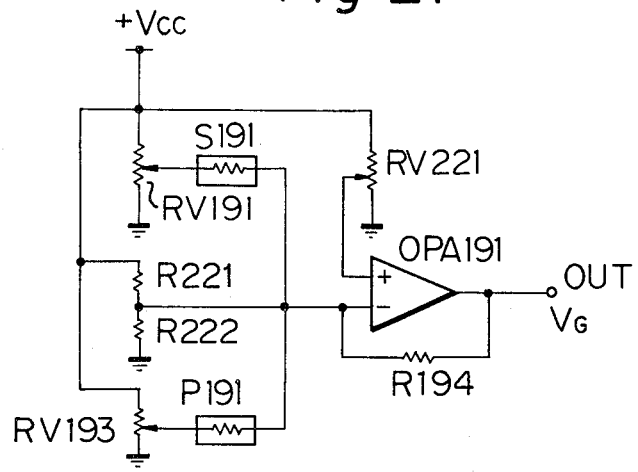
FIG. 21 is a circuit diagram illustrating a temperature compensating voltage generator circuit as still another embodiment of the present invention.

FIG. 21 is a circuit diagram illustrating a temperature compensating voltage generator circuit as still another embodiment of the present invention. In FIG. 21, the same parts as appear in FIG. 19 are designated by the same reference symbols. In FIG. 21, RV221 is an adjustable resistor and R221 and R222 are resistors. At the base temperature, the control voltage $V_G$ is adjusted by the adjustable resistor RV221, and the control voltage $V_G$ is proportional to the difference between the adjusted voltage from the adjustable resistor RV221 and the voltage from the voltage divider circuit comprising of the resistors R221 and R222. At a low temperature, the resistance of the PTC resistor P191 becomes smaller and the voltage adjusted by the adjustable resistor RV193 is mainly added to the voltage at the base temperature. At a high temperature, the resistance of the NTC resistor S191 becomes smaller and the voltage adjusted by the adjustable resistor RV191 is mainly added to the voltage at the base temperature. Therefore, after the adjustment of the control voltage $V_G$ by the adjustable resistor RV221, the control voltages at the low and the high temperatures can be adjusted independently by the adjustable resistors RV193 and RV191.

Figure 22:
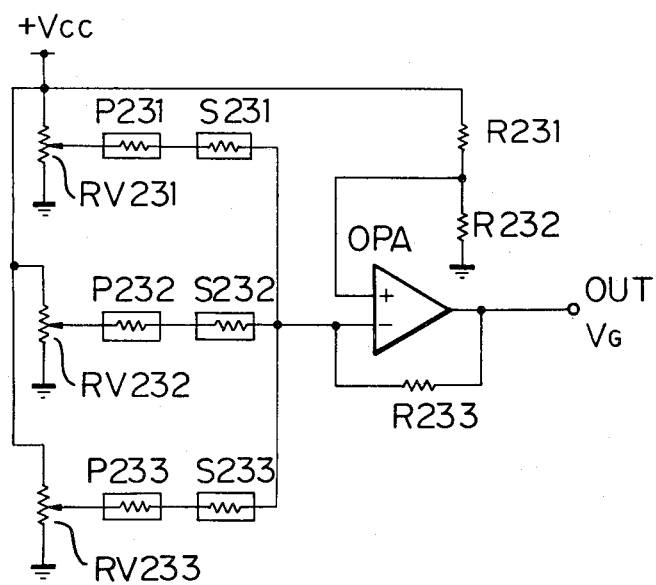
FIG. 22 is a circuit diagram illustrating a temperature compensating voltage generator circuit as still another embodiment of the present invention.
Figure 23:
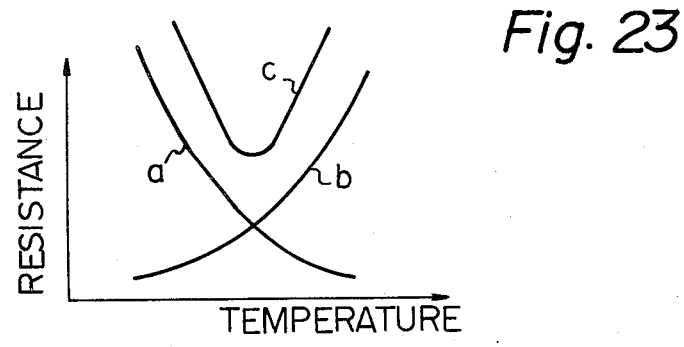
FIG. 23 is a graph illustrating a resistance-temperature characteristic of a temperature sensitive circuit of the circuit of FIG. 22.

FIG. 22 is a circuit diagram illustrating a temperature compensating voltage generator circuit as still another embodiment of the present invention. The circuit of FIG. 22 comprises PTC resistors P231 through P233 whose resistance-temperature characteristics are different from each other, NTC resistors S231 through S233 whose resistance-temperature characteristics are different from each other, an operational amplifier OPA, adjustable resistors RV231 through RV233 which comprising voltage divider circuits and resistors R231 through R233. The temperature characteristic of the resistance of each of the series connection of the PTC resistors and the NTC resistors shows, as illustrated in FIG. 23, a V-shaped curve. The resistance-temperature characteristic of the NTC resistor is represented by a curve a, the resistance-temperature characteristic of the PTC resistor is represented by a curve b and the resistance-temperature characteristic of the series resistance is represented by the V-shaped curve c.

Figure 17:
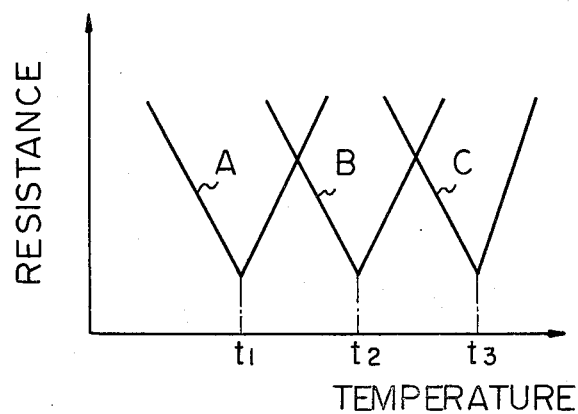
FIG. 17 is a graph illustrating the characteristic of the temperature sensitive circuits included in the circuit of FIG. 16.
Figure 18:
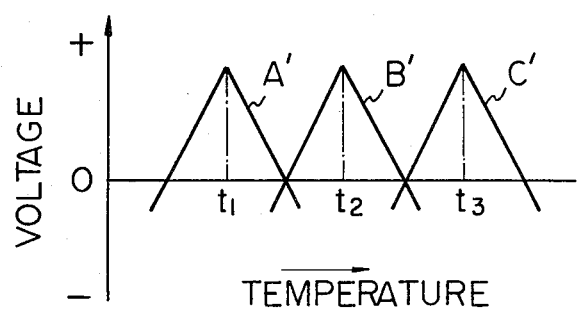
FIG. 18 is a graph illustrating the characteristic of the input voltage of the differential amplifiers of FIG. 16.

Assume the the resistance-temperature characteristics of the series connections of the PTC resistors P231 through P233 and the NTC resistors S231 through S233 are represented, for example, by curves A, B and C of FIG. 17 respectively and the temperatures at which the series resistances of these series connections become minimum are designated by $t_1$, $t_2$ and $t_3$. In this condition, at the lowest temperature $t_1$, the gain to the voltage adjusted by the adjustable resistor RV231 becomes maximum and the control voltage $V_G$ at this temperature can be adjusted by the adjustable resistor RV231. At the temperatures $t_2$ and $t_3$, the control voltage $V_G$ can be adjusted by the adjustable resistors RV232 and RV233 respectively. At the temperatures between the adjusting temperatures $t_1$, $t_2$ and $t_3$, the circuit of FIG. 22 outputs control voltages which continuously vary in accordance with the change of the ambient temperature.

In the embodiment of FIG. 22, the characteristic of the control voltage can be adjusted at three predetermined degrees of temperature. However, it is possible to increase the number of the series connections of the NTC resistors and the PTC resistors and to increase the number of the adjusting points, in order to output the control voltage having a complex temperature characteristic. It is also possible to connect an amplifier to the output terminal OUT which converts an output impedance or which enlarges the variable range of the control voltage $V_G$. It is also possible to connect a photocoupler to the output terminal OUT in order to electrically separate the output terminal OUT and the load circuits.

Figure 24:
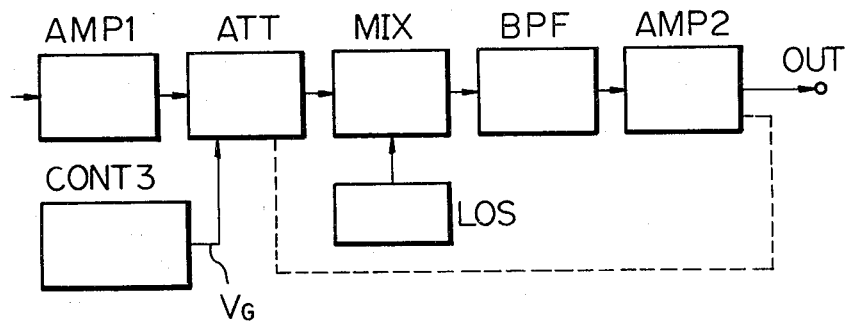
FIG. 24 is a block circuit diagram illustrating a transmitter system having a temperature compensating voltage generator circuit according to the present invention.

FIG. 24 is a block circuit diagram illustrating a transmitter system which includes a control voltage generator according to the present invention. The transmitter system of FIG. 24 comprises an intermediate frequency amplifier AMP1, a voltage controlled attenuator ATT, a mixer MIX, a local oscillator LOS, a band pass filter BPF, a transmitter amplifier AMP2 and a temperature compensating voltage generating CONT3 such as the circuit of FIG. 7 or FIG. 10 in which the control voltage can be adjusted independently at every adjusting temperature. In order to maintain the output signal level at a constant value, the conventional transmitter system used an automatic level control circuit (ALC) including a feedback loop as shown by the dotted line in FIG. 24 but did not contain the control voltage generator circuit CONT3. In such a conventional transmitter system, it was necessary to adjust the loop gain precisely so that the self-oscillation of the system did not occur and thus the design, manufacturing and adjusting of the circuit was difficult. In the transmitter system according to the present invention, the control voltage $V_G$ is applied to the voltage controlled attenuator ATT from the control voltage generator circuit CONT3 in order to compensate the gain-temperature characteristic of the transmitter amplifier AMP2 and to obtain a constant transmitting level. In the system according to the present invention, it is possible to omit the feedback loop contained in the conventional system and, therefore, it is possible to make up a stable transmitter system. In the transmitter system of FIG. 24, it is possible to use any one of the temperature compensating voltage generator circuits mentioned above.

Figure 25:
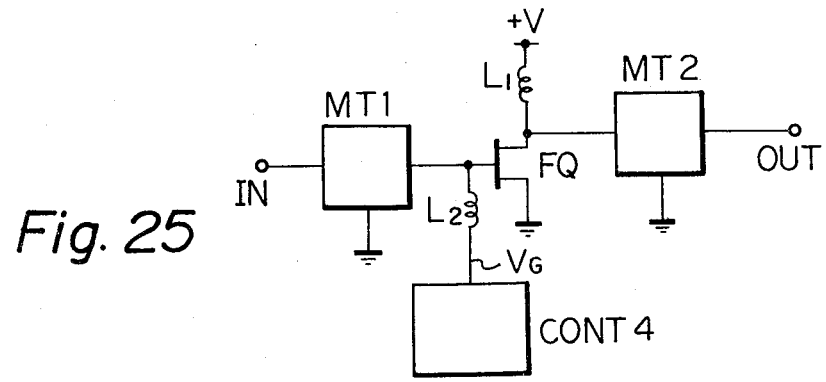
FIG. 25 is a block circuit diagram illustrating an amplifier circuit having a temperature compensating voltage generator circuit according to the present invention.

FIG. 25 is a block circuit diagram illustrating an amplifier circuit which includes a control voltage generator circuit CONT 4 according to the present invention in order to stabilize the gain thereof. The circuit of FIG. 25 comprises impedance matching circuits MT1 and MT2 disposed on the sides of the input terminal IN and the output terminal OUT, a field effect transistor FQ, the control voltage generator circuit CONT4 and two inductors $L_1$ and $L_2$. The control voltage $V_G$ is supplied to the gate electrode of the field effect transistor FQ as a DC bias voltage from the control voltage generator circuit CONT4. The control voltage generator circuit CONT4 generates the bias voltage which compensates for the gain-temperature characteristic of the field effect transistor FQ so that the gain of the amplifier circuit does not change even when the ambient temperature has changed. In the amplifier circuit of FIG. 25, it is possible to use any one of the temperature compensating voltage generator circuits mentioned above.

Figure 26:
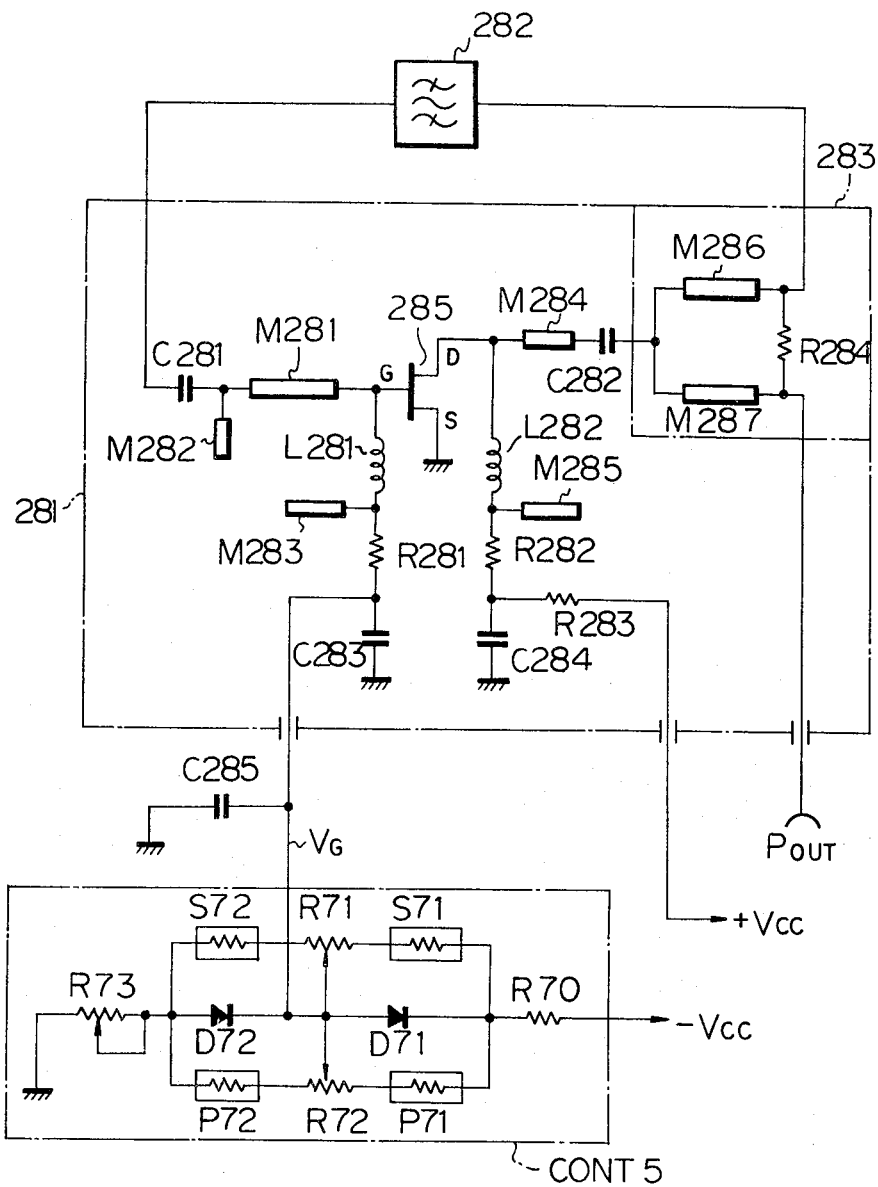
FIG. 26 is a circuit diagram illustrating a microwave local oscillator having a temperature compensating voltage generator circuit according to the present invention.

FIG. 26 is a circuit diagram illustrating a local oscillator which is used in a microwave multiplex wireless communication system and whose oscillation frequency is stabilized by the control voltage generator circuit according to the present invention, for example, the control voltage generator circuit of FIG. 7. The oscillator of FIG. 26 comprises an amplifier section 281, a dielectric resonator 282, a hybrid circuit 283, a temperature compensating voltage generator circuit CONT5 and a decoupling capacitor C285. The amplifier section 281 comprises a field effect transistor 285, strip lines for impedance matching M281 through M285, resistors R281 through R283, capacitors C281 through C284 and inductors L281 and L282. The hybrid circuit 283 comprises strip lines M286 and M287 each of which has a length that is a quarter of a wave length, and a resistor R284, and the hybrid circuit 283 distributes an output signal from the amplifier section 281 to the dielectric resonator 282 and an output terminal $P_{out}$. It is possible to use any one of the temperature compensating voltage generator circuits mentioned above.

In the circuit of FIG. 26, the quantity of the phase shift from the input to the output of the amplifier section 281 which uses the field effect transistor 285 can be changed by changing the control voltage $V_G$ which is a gate bias voltage of the field effect transistor 285, so that the oscillation frequency can be finely changed. Therefore, the temperature characteristic of the oscillation frequency can be compensated by appropriately selecting parameters of the temperature compensating voltage generator circuit CONT5. In order to confirm that the oscillation frequency can be stabilized by the temperature compensating voltage generator circuit CONT5, an experiment was done by using a local oscillator whose oscillation frequency was 6 GHz and whose output signal level was +10 dBm. In this experiment, the frequency stability of the local oscillator was improved from $\pm 3 \times 10^{-5}$ to $\pm 1 \times 10^{-5}$.

As mentioned above, in the temperature compensating voltage generator circuit according to the present invention, the characteristic of the temperature compensating voltage can be adjusted independently at every adjusting temperature and the temperature compensating voltage varies continuously according to the change of the ambient temperature. Therefore, the temperature compensation of the characteristics of the electric circuits such as an oscillator, an amplifier, a voltage regulator, a transmitter and a receiver and so on can be effected almost completely. Moreover, according to the present invention, the characteristic of the control voltage can be readjusted without stopping the operation of the electric circuit by using the adjustable resistor corresponding to the ambient temperature, even if the characteristics of the electrical circuit has changed due to the variation over a period of time.

We claim:

1. A temperature compensating voltage generator circuit for compensating temperature characteristics of an electric circuit whose electrical characteristic can be controlled by a control voltage, comprising:
   a plurality of temperature sensitive circuits each of which comprises a parallel connection of a diode circuit and a temperature sensitive resistor circuit, said temperature sensitive circuits being connected in series; and
   one or more resistor circuits which are operatively connected in series with said plurality of temperature sensitive circuits, the series connection of said temperature sensitive circuits and said resistor circuits comprising a voltage divider circuit, a divided output voltage from said voltage divider circuit being used as a temperature compensating voltage for said electric circuit.

2. A temperature compensating voltage generator circuit as claimed in claim 1, wherein said temperature sensitive resistor circuit is a series connection of a resistor and a temperature sensitive resistor.

3. A temperature compensating voltage generator circuit as claimed in claim 2, wherein said temperature sensitive resistor is a negative temperature coefficient temperature sensitive resistor.

4. A temperature compensating voltage generator circuit as claimed in claim 2, wherein said temperature sensitive resistor is a positive temperature coefficient temperature sensitive resistor.

5. A temperature compensating voltage generator circuit as claimed in claim 1, wherein said temperature sensitive resistor circuit is a parallel connection of a plurality of series connections of a resistor and a temperature sensitive resistor.

6. A temperature compensating voltage generator circuit as claimed in any one of claims 1, 2, 3, 4, or 5, wherein said diode circuit is a series connection of one or more diodes.

7. A temperature compensating voltage generator circuit as claimed in any one of claims 1, 2, 3, 4, or 5, wherein said diode circuit is a series connection of one or more zener diodes.

8. A temperature compensating voltage generator circuit for compensating temperature characteristics of an electric circuit whose electrical characteristics can be controlled by a control voltage, comprising:
 a plurality of voltage dividers each of which comprises a resistor circuit and a tempersture sensitive resistor circuit, said temperature sensitive resistor circuit being operatively connected to said resistor circuit at a voltage divider node and each voltage divider for generating a divided output voltage;
 a plurality of differential amplifiers, each operatively connected to a respective one of the voltage divider nodes, each of which receives one of the divided output voltages from one of said voltage dividers and generates amplified output voltages;
 a plurality of level adjusting circuits, each operatively connected to a respective one of said differential amplifiers, for adjusting levels of the amplified output voltages from said differential amplifiers and for generating adjusted output voltages; and
 a combining circuit, operatively connected to said level adjusting circuits, which combines the adjusted output voltages from said level adjusting circuits in order to generate a temperature compensating voltage.

9. A temperature compensating voltage generator circuit as claimed in claim 8, wherein said temperature compensating voltage generator circuit further comprises a voltage dividing circuit comprising a plurality of resistor circuits operatively connected to said combining circuit, the output voltage from said voltage dividing circuit being applied to said combining circuit.

10. A temperature compensating voltage generator circuit as claimed in claim 9, wherein said voltage dividing circuit, comprising a plurality of resistor circuits, comprises an adjustable resistor operatively connected to said combining circuit.

11. A temperature compensating voltage generator circuit as claimed in claim 8, further comprising a plurality of diodes operatively connected between said voltage dividers and said differential amplifiers.

12. A temperature compensating voltage generator circuit as claimed in claim 11, wherein the divided output voltage from each of said voltage dividers falls or rises so as to turn on one of said diodes in a predetermined temperature range.

13. A temperature compensating voltage generator circuit as claimed in any one of claims 8, 9, 10, 11 or 12, wherein said temperature sensitive resistor circuit comprises a negative temperature coefficient temperature sensitive resistor operatively connected to the respective voltage divider node.

14. A temperature compensating voltage generator circuit as claimed in any one of claims 8, 9, 10, 11 or 12, wherein said temperature sensitive resistor circuit comprises a positive temperature coefficient temperature sensitive resistor operatively connected to the respective voltage divider node.

15. A temperature compensating voltage generator circuit as claimed in any one of claims 8, 9, 10, 11 or 12, wherein said temperature sensitive resistor circuit comprises a series connection of a negative temperature coefficient temperature sensitive resistor and a positive temperature coefficient temperature sensitive resistor, said series connection operatively connected to the respective voltage divider node.

16. A temperature compensating voltage generator circuit as claimed in claim 15, wherein the resistance of said temperature sensitive resistor circuit decreases in a predetermined temperature range.

17. A temperature compensating voltage generator circuit for compensating temperature characteristics of an electric circuit whose electrical characteristics can be controlled by a control voltage, comprising:
 a plurality of first voltage divider circuits which include first adjustable resistors and which generate first output voltages adjustable by said first adjustable resistors;
 a plurality of temperature sensitive resistor circuits each operatively connected to a respective one of said first voltage divider circuits; and
 an operational amplifier, operatively connected to said temperature sensitive resistor circuits, having a first input terminal which receives said first output voltages from said first voltage divider circuits through said temperature sensitive resistor circuits and which outputs a temperature compensating voltage.

18. A temperature compensating voltage generator circuit as claimed in claim 17, further comprising;
 a second voltage divider circuit which includes a second adjustable resistor and generates a second output voltage adjustable by said second adjustable resistor; and
 a resistor circuit, operatively connected between said second adjustable resistor and said first input terminal of said operational amplifier, for applying said second output voltage from said adjustable resistor to said first input terminal of said operational amplifier.

19. A temperature compensating voltage generator circuit as claimed in claim 17, wherein said operational amplifier has a second input terminal, wherein said temperature compensating voltage generator circuit further comprises:
 a second voltage divider circuit comprising fixed resistors for generating a second output voltage, said fixed resistors operatively connected to said second input of said operational amplifier; and
 a third voltage divider circuit which includes a second adjustable resistor operatively connected to said first input of said operational amplifier, for generating a third output voltage adjustable by said second adjustable resistor and for applying said third output voltage to the first input terminal of said operational amplifier.

20. A temperature compensating voltage generator circuit as claimed in any one of claims 17, 18 or 19, wherein said temperature sensitive resistor circuits comprise negative temperature coefficient temperature sensitive resistors each operatively connected between a respective one of said first voltage divider circuits and said operational amplifier.

21. A temperature compensating voltage generator circuit as claimed in any one of claims 17, 18 or 19, wherein said temperature sensitive resistor circuits comprise series connections of negative temperature coefficient temperature sensitive resistors and positive temperature coefficient temperature sensitive resistors, each said series connection operatively connected between a respective one of said first voltage divider circuits and said operational amplifier.

22. A temperature compensating voltage generator circuit as claimed in claim 17, 18 or 19, wherein said temperature sensitive resistor circuits comprise positive temperature coefficient temperature sensitive resistors each operatively connected between a respective one of said first voltage divider circuits and said operational amplifier.

23. A temperature compensating voltage generator circuit for compensating temperature characteristics of an electric circuit whose electrical characteristics can be controlled by a temperature compensating control voltage, comprising:
   a resistor; and
   a temperature sensitive circuit operatively connected to said resistor, including:
      a diode operatively connected to said resistor at a voltage divider node; and
      a temperature sensitive resistor circuit operatively connected in parallel with said diode, a divided output voltage generated at the voltage divider node being used as the temperature compensating control voltage for said electric circuit.

24. A temperature compensating voltage generator circuit for compensating temperature characteristic of an electric circuit whose electrical characteristic can be controlled by a temperature compensating control voltage, comprising:
   a voltage divider including:
      a resistor; and
      a temperature sensitive resistor circuit operatively connected to said resistor at a voltage divider node;
   a differential amplifier operatively connected to the voltage divider node, for generating an amplified output voltage;
   a level adjusting circuit, operatively connected to said differential amplifier, for generating an adjusted output voltage from the amplified output voltage;
   a base temperature control circuit for generating a base temperature control voltage; and
   a combining circuit, operatively connected to said level adjusting circuit and said base temperature control circuit, for combining the adjusted output voltage and the base temperature control voltage into the temperature compensating control voltage.

25. A temperature compensating voltage generator circuit for compensating temperature characteristics of an electric circuit whose electrical characteristics can be controlled by a temperature compensating control voltage, comprising:
   a voltage divider circuit having an adjustable resistance;
   a temperature sensitive resistor circuit, operatively connected to said voltage divider circuit; and
   an operational amplifier, operatively connected to said temperature sensitive resistor circuit, for generating the temperature compensating voltage.

* * * * *

UNITED STATES PATENT AND TRADEMARK OFFICE
CERTIFICATE OF CORRECTION

PATENT NO. : 4,352,053
DATED : Sep. 28, 1982
INVENTOR(S) : TAKURO OGUCHI ET AL.

It is certified that error appears in the above-identified patent and that said Letters Patent is hereby corrected as shown below:

```
Column 2, line 26, after "connected" insert --in--;
          line 40, delete ";".
Column 4, line 66, ";" (second occurrence) should be
--,--;
          line 68, "," (first occurrence) should be
--;--.
Column 5, line 2, "," (first occurrence) should be --;--.
Column 7, line 1, delete "(";
          line 2, delete ")".
Column 9, line 63, delete "of";
          line 65, delete "of".
Column 11, line 42, after "perature" insert --,--.
Column 12, line 62, "comprising" should be  --comprises--;
           line 62, delete "of".
Column 13, line 33, [correct print size].
Column 14, line 21, "prising" should be --prise--;
           line 31, "the" (first occurrence) should be
--that--.
Column 19, line 33, "characteristic" should be
--characteristics--;
           line 34, "characteristic" should be-- characteristics--.
```

Signed and Sealed this

Twenty-second  Day of March 1983

[SEAL]

Attest:

GERALD J. MOSSINGHOFF

Attesting Officer    Commissioner of Patents and Trademarks